(12) United States Patent
Han et al.

(10) Patent No.: US 10,713,464 B2
(45) Date of Patent: Jul. 14, 2020

(54) FINGERPRINT IDENTIFICATION SUBSTRATE AND FABRICATION METHOD THEREOF, DISPLAY PANEL AND DISPLAY APPARATUS

(71) Applicant: BOE TECHNOLOGY GROUP CO., LTD., Beijing (CN)

(72) Inventors: Yanling Han, Beijing (CN); Xue Dong, Beijing (CN); Jing LV, Beijing (CN); Haisheng Wang, Beijing (CN); Chun Wei Wu, Beijing (CN); Xiaoliang Ding, Beijing (CN); Yingming Liu, Beijing (CN); Pengpeng Wang, Beijing (CN); Wei Liu, Beijing (CN); Xueyou Cao, Beijing (CN); Yanan Jia, Beijing (CN); Lijun Zhao, Beijing (CN); Changfeng Li, Beijing (CN); Rui Xu, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 15/560,050

(22) PCT Filed: Apr. 1, 2017

(86) PCT No.: PCT/CN2017/079285
§ 371 (c)(1),
(2) Date: Sep. 20, 2017

(87) PCT Pub. No.: WO2018/000880
PCT Pub. Date: Jan. 4, 2018

(65) Prior Publication Data
US 2018/0307887 A1    Oct. 25, 2018

(30) Foreign Application Priority Data
Jun. 30, 2016 (CN) .......................... 2016 1 0509585

(51) Int. Cl.
*G06K 9/00* (2006.01)
*H01L 51/50* (2006.01)
(Continued)

(52) U.S. Cl.
CPC ............ *G06K 9/0004* (2013.01); *H01L 21/70* (2013.01); *H01L 27/12* (2013.01); *G06K 2009/0006* (2013.01); *H01L 51/50* (2013.01)

(58) Field of Classification Search
CPC ......... G06K 9/0004; G06K 2009/0006; G06K 9/00; H01L 27/12; H01L 21/70; H01L 51/50; H01L 21/707; H01L 27/1214
(Continued)

(56) References Cited

U.S. PATENT DOCUMENTS 8,842,231 B2 * 9/2014 Liu ..................... H01L 27/1214
349/46
9,754,150 B2 * 9/2017 Wu ....................... G06K 9/0004
(Continued)

FOREIGN PATENT DOCUMENTS

| CN | 102073860 A | 5/2011 |
|---|---|---|
| CN | 103809336 A | 5/2014 |

(Continued)

OTHER PUBLICATIONS

Chinese Office Action in Chinese Application No. 201610509585.9, dated Sep. 26, 2018 with English translation.
(Continued)

*Primary Examiner* — Bobbak Safaipour
(74) *Attorney, Agent, or Firm* — Collard & Roe, P.C.

(57) ABSTRACT

A fingerprint identification substrate and a fabrication method thereof, a display panel and a display apparatus are provided. The fingerprint identification substrate includes a base substrate and a plurality of fingerprint identification units on the base substrate. Each fingerprint identification
(Continued)

unit includes a photosensitive sense electrode and a thin film transistor which are positioned on the base substrate, the photosensitive sense electrode is positioned between the base substrate and the thin film transistor, and the photosensitive sense electrode is electrically connected with a source electrode or a drain electrode of the thin film transistor.

20 Claims, 5 Drawing Sheets

(51) Int. Cl.
*H01L 21/70* (2006.01)
*H01L 27/12* (2006.01)

(58) Field of Classification Search
USPC .......................................................... 382/124
See application file for complete search history.

(56) References Cited

U.S. PATENT DOCUMENTS

| | | | |
|---|---|---|---|
| 10,002,281 B2* | 6/2018 | Wu | G06K 9/0004 |
| 10,139,479 B2* | 11/2018 | Lu | G06F 3/0436 |
| 10,607,061 B2* | 3/2020 | Zeng | G06K 9/00013 |
| 2010/0001277 A1* | 1/2010 | Jeong | H01L 27/1214 257/59 |
| 2011/0267445 A1* | 11/2011 | Oguchi | A61B 5/1172 348/77 |
| 2011/0297936 A1* | 12/2011 | Makita | H01L 27/1214 257/53 |
| 2013/0240890 A1 | 9/2013 | Chang | |
| 2013/0314636 A1* | 11/2013 | Chen | G02F 1/1343 349/43 |
| 2016/0103531 A1 | 4/2016 | Kimura et al. | |
| 2017/0168615 A1* | 6/2017 | Huang | G09G 3/3688 |
| 2017/0221972 A1 | 8/2017 | Yang et al. | |
| 2017/0255810 A1 | 9/2017 | Liu et al. | |
| 2017/0337418 A1 | 11/2017 | Wang et al. | |
| 2018/0040675 A1* | 2/2018 | Zeng | G06K 9/0004 |
| 2018/0150668 A1 | 5/2018 | Li et al. | |
| 2018/0217430 A1* | 8/2018 | Ding | G02F 1/136286 |
| 2018/0247099 A1* | 8/2018 | Liu | H01L 27/323 |
| 2019/0332844 A1* | 10/2019 | Liu | G06K 9/0004 |

FOREIGN PATENT DOCUMENTS

| | | |
|---|---|---|
| CN | 203930881 U | 11/2014 |
| CN | 104964702 A | 10/2015 |
| CN | 105047689 A | 11/2015 |
| CN | 105184247 A | 12/2015 |
| CN | 105308542 A | 2/2016 |
| CN | 105373772 A | 3/2016 |
| CN | 105550662 A | 5/2016 |
| CN | 105975963 A | 9/2016 |
| KR | 10-2014-0062341 A | 5/2014 |

OTHER PUBLICATIONS

International Search Report of PCT/CN2017/079285 in Chinese, dated Jul. 3, 2017 with English translation.
Notice of Transmittal of the International Search Report of PCT/CN2017/079285 in Chinese, dated Jul. 3, 2017.
Written Opinion of the International Searching Authority of PCT/CN2017/079285 in Chinese, dated Jul. 3, 2017 with English translation.

* cited by examiner

FINGERPRINT IDENTIFICATION SUBSTRATE AND FABRICATION METHOD THEREOF, DISPLAY PANEL AND DISPLAY APPARATUS

CROSS REFERENCE TO RELATED APPLICATIONS

This application is the National Stage of PCT/CN2017/079285 filed on Apr. 1, 2017, which claims priority under 35 U.S.C. § 119 of Chinese Application No. 201610509585.9 filed on Jun. 30, 2016, the disclosure of which is incorporated by reference.

TECHNICAL FIELD

Embodiments of the present disclosure relate to a fingerprint identification substrate and a fabrication method thereof, a display panel and a display apparatus.

BACKGROUND

Along with rapid development of a display technology, a display panel with a fingerprint identification function has been applied all over. Currently, a fingerprint identification unit of the fingerprint identification display panel is generally arranged inside the display panel, and is beneficial to lighting and thinning of the display panel.

The existing fingerprint identification unit generally includes a thin film transistor and a photosensitive sense electrode, and the thin film transistor and the photosensitive sense electrode are arranged in parallel, and thus, the fingerprint identification unit occupies a relatively large area, and meanwhile, a shielding layer needs to be arranged for each fingerprint identification unit to avoid influence of light emitted by the display panel on the fingerprint identification unit, and thus, obviously, a structure of the existing fingerprint identification unit will reduce the aperture rate of the display panel and influence a display effect; and moreover, due to a limited space of the display panel, the photosensitive sense electrode is limited to the space, but cannot have an enough large area, thus influencing performance of the fingerprint identification unit.

SUMMARY

An embodiment of the present disclosure provides a fingerprint identification substrate, including a base substrate and a plurality of fingerprint identification units on the base substrate, wherein each fingerprint identification unit includes a photosensitive sense electrode and a thin film transistor which are positioned on the base substrate, the photosensitive sense electrode is positioned between the base substrate and the thin film transistor, and the photosensitive sense electrode is electrically connected with a source electrode or a drain electrode of the thin film transistor.

In an example, the photosensitive sense electrode and the thin film transistor are overlapped with each other in a direction substantially perpendicular to the base substrate.

In an example, each fingerprint identification unit further includes a signal line, the signal line and a gate electrode of the thin film transistor are arranged on a same layer, and the signal line is electrically connected with the photosensitive sense electrode.

In an example, each fingerprint identification unit further includes a first transparent electrode, and the first transparent electrode is arranged between the photosensitive sense electrode and the base substrate and is in direct contact with the photosensitive sense electrode; and the signal line is electrically connected with the photosensitive sense electrode via the first transparent electrode.

In an example, an orthogonal projection of the photosensitive sense electrode on the base substrate locates in an orthogonal projection of the first transparent electrode on the base substrate.

In an example, the fingerprint identification unit further includes a shielding layer direct above the thin film transistor; and orthogonal projections of the thin film transistor and the photosensitive sense electrode on the base substrate locate in an orthogonal projection of the shielding layer on the base substrate.

In an example, the shielding layer and the thin film transistor are insulated from each other.

In an example, the fingerprint identification unit further includes a second transparent electrode, the second transparent electrode is arranged between the photosensitive sense electrode and the thin film transistor and is in direct contact with the photosensitive sense electrode, and the orthogonal projection of the photosensitive sense electrode on the base substrate completely coincides with an orthogonal projection of the second transparent electrode on the base substrate.

In an example, orthogonal projections of the signal line and the transparent electrodes on the base substrate at least partially overlap.

In an example, the thin film transistor is of bottom gate type.

Another embodiment of the present disclosure provides a display panel, including: the fingerprint identification substrate according to any one of claims 1 to 10, and a display unit array.

In an example, the display unit array includes a plurality of organic light emitting units, the fingerprint identification substrate is positioned on a light emergent side of the plurality of organic light emitting units, and the plurality of organic light emitting units are configured to emit light to pass through portions of the fingerprint identification substrate, which are positioned between a plurality of fingerprint identification units.

In an example, the display panel further includes a liquid crystal layer positioned between the fingerprint identification substrate and the display unit array, wherein the display unit array includes a plurality of pixel units, the fingerprint identification substrate is positioned on a light emergent side of the plurality of pixel units, and the plurality of pixel units are configured to emit light to pass through portions of the fingerprint identification substrate, which are positioned between the plurality of fingerprint identification units.

In an example, the display panel further includes another base substrate opposite to the fingerprint identification substrate, and the display unit array is positioned on a side of the another base substrate facing to the fingerprint identification substrate.

In an example, the display panel further includes a polarizing film layer and a protective cover board which are positioned on a side of the fingerprint identification substrate facing away from the fingerprint identification substrate, and an optical adhesive layer positioned between the polarizing film layer and the protective cover board.

Yet another embodiment of the present disclosure provides a display apparatus, including the display panel described above.

Yet another embodiment of the present disclosure provides a fabrication method of a fingerprint identification substrate, including: forming a photosensitive sense electrode on a base substrate; and forming a thin film transistor on the photosensitive sense electrode, wherein the photosensitive sense electrode is positioned between the base substrate and the thin film transistor, and the photosensitive sense electrode is electrically connected with a source electrode or a drain electrode of the thin film transistor.

In an example, the photosensitive sense electrode and the thin film transistor overlap with each other in a direction substantially perpendicular to the base substrate.

In an example, the method further includes: forming a signal line electrically connected with the photosensitive sense electrode, wherein the signal line and a gate electrode of the thin film transistor are simultaneously formed on the same layer.

In an example, the method, before the photosensitive sense electrode is formed, further includes: forming a first transparent electrode on the base substrate, wherein the first transparent electrode is in direct contact with the photosensitive sense electrode; and the signal line is electrically connected with the photosensitive sense electrode via the first transparent electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment of the disclosure will be described in a clearly and fully understandable way in connection with the drawings related to the embodiments of the disclosure. It is obvious that the described embodiments of the disclosure are just a part but not all of the embodiments of the disclosure. Based on the described embodiments herein, those skilled in the art can obtain other embodiment(s), without any inventive work, which should be within the scope of the disclosure.

It should be noted that from beginning to end, same or similar signs represent similar or similar components or components with same or similar functions.

Figure 1:
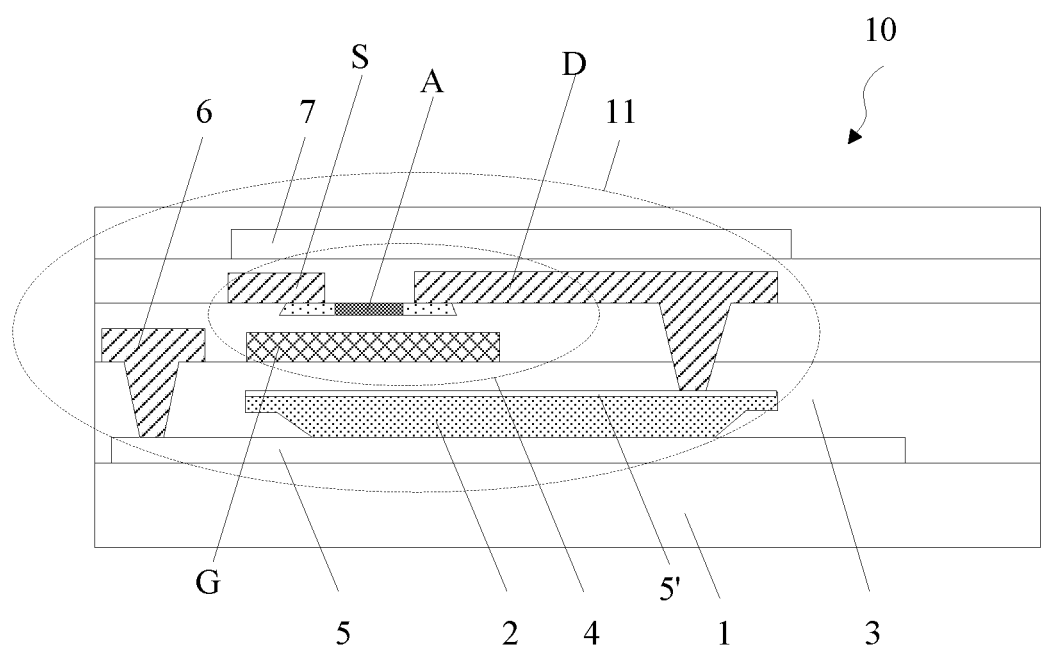
FIG. 1 is a partial sectional schematic diagram of a fingerprint identification substrate provided by an embodiment of the present disclosure.

With reference to FIG. 1, an embodiment of the present disclosure provides a fingerprint identification substrate 10, which includes a base substrate 1 and a plurality of fingerprint identification units 11 formed on the base substrate 1; and each fingerprint identification unit 11 includes a photosensitive sense electrode 2, an insulating layer 3 and a thin film transistor 4 which are sequentially formed on the base substrate 1, and the photosensitive sense electrode 2, the insulating layer 3 and the thin film transistor 4 are arranged in stack, wherein the photosensitive sense electrode 2 is electrically connected with a source electrode or a drain electrode of the thin film transistor 4. Herein, the photosensitive sense electrode 2 is positioned between the base substrate 1 and the thin film transistor 4. The thin film transistor 4 includes a gate electrode G, an active layer A, the source electrode S and the drain electrode D. Herein, the photosensitive sense electrode 2 is positioned between the base substrate 1 and the thin film transistor 4 means a layer where the photosensitive sense electrode 2 is positioned is positioned between the base substrate and the layer where each of the gate electrode G, the active layer A, the source electrode S and the drain electrode D of the thin film transistor 4 is positioned.

In the embodiment, the photosensitive sense electrode 2, the insulating layer 3 and the thin film transistor 4, which are included in the fingerprint identification unit of the fingerprint identification substrate 10, are arranged in an overlapping mode in a direction substantially perpendicular to the base substrate 1. That is, in the direction substantially perpendicular to the base substrate 1, the photosensitive sense electrode 2 and at least one of the gate electrode G, the active layer A, the source electrode S and the source electrode D of the thin film transistor 4 are arranged in an overlapping mode. In FIG. 1, the photosensitive sense electrode 2 and each of the gate electrode G, the active layer A, the source electrode S and the source electrode D of the thin film transistor 4 are arranged in an overlapping mode. Therefore, an area occupied by the fingerprint identification unit 11 is reduced, and when the fingerprint identification substrate 10 is applied to a display panel, an aperture ratio can be improved, so that a display effect is improved; and meanwhile, an area of the photosensitive sense electrode 2 can be larger, and performance of the fingerprint identification unit 11 is improved.

A signal generated by the fingerprint identification unit 11 in the working process needs to be exported to an external circuit so as to carry out analysis operation on acquired data, and thus, a corresponding wire needs to be provided. Herein, the external circuit, for example, means a touch screen control chip. For example, the fingerprint identification unit 11 further includes a first transparent electrode 5 and a signal line 6 for extending to the external circuit, and the signal line 6 is electrically connected with the photosensitive sense electrode 2. By arranging the signal line 6 on a same layer with the gate electrode G of the thin film transistor 3, a fabrication process can be saved. Herein, the gate electrode G and the signal line 6 are arranged on the same layer means that the gate electrode G and the signal line 6 are formed by a same thin film through a patterning process.

Electrical connection between the signal line 6 and the photosensitive sense electrode 2 may be implemented in various modes, for example, direct connection through a via hole or connection through a conductor. For example, the fingerprint identification unit 11 includes the first transparent electrode 5, the first transparent electrode 5 is arranged between the photosensitive sense electrode 2 and the base substrate 1 and is in direct contact with the photosensitive sense electrode 2, and the signal line 6 is electrically connected with the photosensitive sense electrode 2 via the first transparent electrode 5. Via the first transparent electrode 5, electrical connection between the signal line 6 and the photosensitive sense electrode 2 is implemented, so that the fingerprint identification unit 11 is connected to the external circuit to implement export of a signal.

When the thin film transistor is influenced by light, a current is generated and a switching function or a characteristic curve of the thin film transistor may be influenced, and thus, shielding can be carried out; meanwhile, it needs to be considered that the photosensitive sense electrode 2 should be protected from the influenced of light emission of a pixel unit of the display panel. For example, the fingerprint identification unit 11 further includes a shielding layer 7 formed direct above the thin film transistor 3, and the shielding layer 7 is insulated from the thin film transistor 3; and orthogonal projections of the thin film transistor 3 and the photosensitive sense electrode 2 on the base substrate 1 fall in an orthogonal projection range of the shielding layer 7 on the base substrate 1. Namely, the orthogonal projections of each of the gate electrode G, the active layer A, the source electrode S and the drain electrode D of the thin film transistor 4 and the photosensitive sense electrode 2 on the base substrate 1 are substantially completely positioned in the orthogonal projection of the shielding layer 7 on the base substrate 1, substantially without exceeding the orthogonal projection of the shielding layer 7 on the base substrate 1. Herein, the orthogonal projections, for example, are projections generated in the direction substantially perpendicular to the base substrate. In the embodiment, the thin film transistor 3 is shielded by the shielding layer 7 so as to avoid influence of light on the thin film transistor 3.

For example, the orthogonal projections of the signal line 6 and the first transparent electrode 5 on the base substrate 1 partially overlap; and the orthogonal projection of the photosensitive sense electrode 2 on the base substrate 1 falls in the orthogonal projection of the transparent electrode 5 on the base substrate 1. That is, the orthogonal projection of the photosensitive sense electrode 2 on the base substrate 1 is substantially completely positioned in the orthogonal projection of the first transparent electrode 5 on the base substrate 1, substantially without exceeding the orthogonal projection of the first transparent electrode 5 on the base substrate 1. In the embodiment, the orthogonal projections of the signal line 6 and the transparent electrode 5 are overlapped, and thus, a via hole can be prepared in a direction substantially perpendicular to the base substrate 1 without an additional extension line, so that a space is saved.

The thin film transistor 2 may be of top gate type, or may be of bottom gate type. For example, the thin film transistor 2 is of bottom gate type, and a layer where the gate electrode of the bottom-gate type thin film transistor 2 is positioned can further include the signal line 6, so that a fabrication process can be simplified.

It should be noted that for example, in order to carry out protection on the photosensitive sense electrode 2, a second transparent electrode 5' may also be formed on the photosensitive sense electrode 2 and is similar with the first transparent electrode 5 below the photosensitive sense electrode 2, but the size of the second transparent electrode 5' on the photosensitive sense electrode 2 may be equal to that of the photosensitive sense electrode 2. Namely, the second transparent electrode 5' is in direct contact with the photosensitive sense electrode 2, and the orthogonal projection of the photosensitive sense electrode 2 on the base substrate 1 substantially completely coincides with the orthogonal projection of the second transparent electrode 5' on the base substrate 1.

Moreover, the fingerprint identification unit 11 structurally may have a plurality of insulating layers. for example,
a passivation layer, a flattening layer on the shielding layer and a gate insulating layer in the thin film transistor 2 (each layer is not marked) all have the insulating function. Therefore, the fingerprint identification substrate 10 provided by the embodiment of the present disclosure is illustrated, but the layer number of the insulating layers and corresponding parts are not limited. As long as a fingerprint identification function is achieved, modifications without departure from the principle of the present disclosure shall fall within the scope of the present disclosure.

The embodiment of the present disclosure has the beneficial effects that: the photosensitive sense electrode 2, the insulating layer 3 and the thin film transistor 4, which the fingerprint identification unit 11 of the fingerprint identification substrate 10 includes, are stacked in the direction substantially perpendicular to the base substrate 1, and thus, the area occupied by the fingerprint identification unit 11 is reduced, and when the fingerprint identification substrate 10 is applied to the display panel, the aperture ratio can be improved, so that the display effect is improved; meanwhile, the photosensitive sense electrode 2 can have a larger area, and performance of the fingerprint identification unit 11 is improved.

Figure 2:
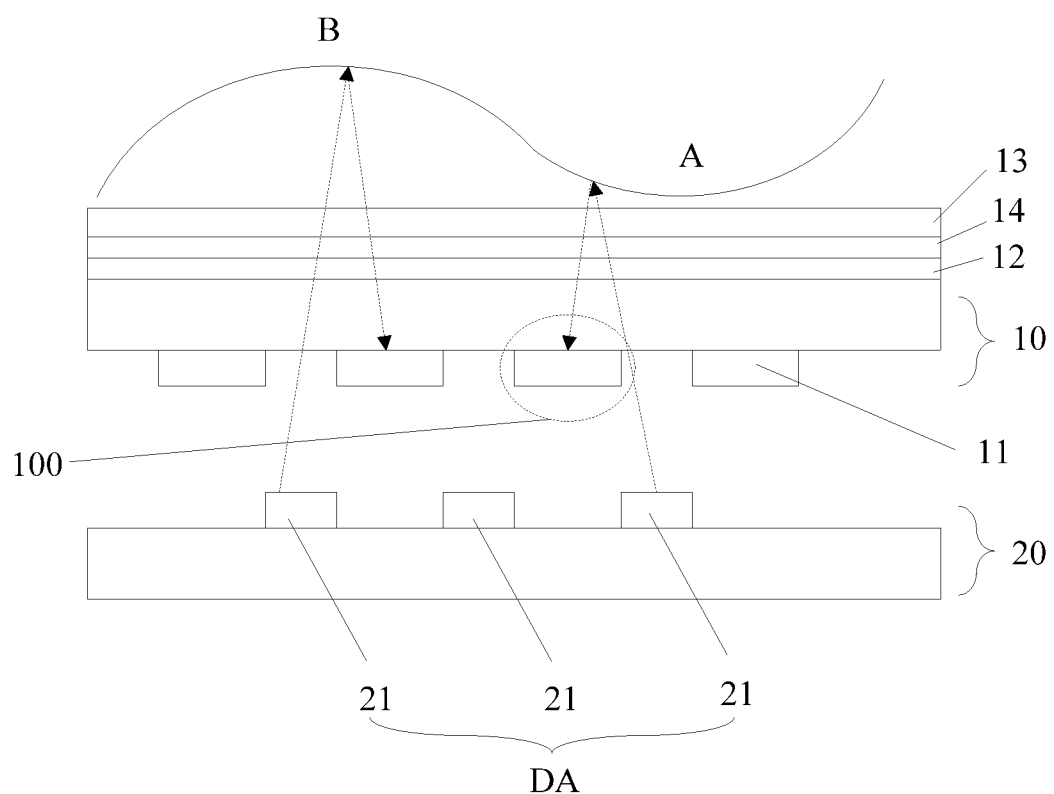
FIG. 2 is a structural schematic diagram of a display panel provided by an embodiment of the present disclosure.

An embodiment of the present disclosure further provides a display panel, which includes the fingerprint identification substrate 10 provided by the above-mentioned embodiment. It should be noted that that the display panel may be a liquid crystal display panel, and may also be an organic light emitting display panel. In order to understand the embodiment of the present disclosure more clearly, illustration will be carried out as followings in connection with FIG. 2 and FIG. 3:

As shown in FIG. 2, the display panel further includes an organic light emitting module 20, the fingerprint identification substrate 10 is positioned on a light emergent side of the organic light emitting module 20, the organic light emitting module 20 includes an array substrate, and a plurality of organic light emitting units 21 are arranged on a surface of the array substrate facing to the fingerprint identification substrate; and each fingerprint identification unit 11 of the fingerprint identification substrate 10 respectively corresponds to a region position between the respective organic light emitting units 21. Herein, the light emitting unit 21 is an example of a display unit, and the plurality of light emitting units 21 form a display unit array.

The fingerprint identification substrate 10 may be flexibly arranged, and for example, a surface of the fingerprint identification substrate 10, where the fingerprint identification unit 11 is positioned, faces the array substrate; for another example, the surface of the fingerprint identification substrate 10, where the fingerprint identification unit 11 is positioned, faces away from the array substrate.

In order to enable the display panel to have a better display effect and based on the aim of protecting the display panel, for example, the display panel further includes a polarizing film layer 12 and a protective cover board 13 which are formed on a surface of the fingerprint identification substrate 10 facing away from the array substrate, and the polarizing film layer 12 is adhered to the protective cover board 13 via an optical adhesive layer 14.

A principle of fingerprint identification is as follows: the surface of skin of a finger have rugged ridges A and valleys B, when fingerprint identification is carried out, light emitted by the organic light emitting units 21 is irradiated to positions of the ridges A and the valleys B of the finger and is reflected to the fingerprint identification unit 11, and the light reaching the fingerprint identification unit 11 after being reflected by the positions of the ridges A and the valleys B is different in intensity, and thus, by detecting difference in a size of a current signal output by every fingerprint identification unit 11 at every moment in the process that the finger touches the surface of the display panel, a fingerprint two-dimensional pattern formed by the ridges A and the valleys B corresponding to the finger can be detected so as to implement fingerprint identification.

Figure 3:
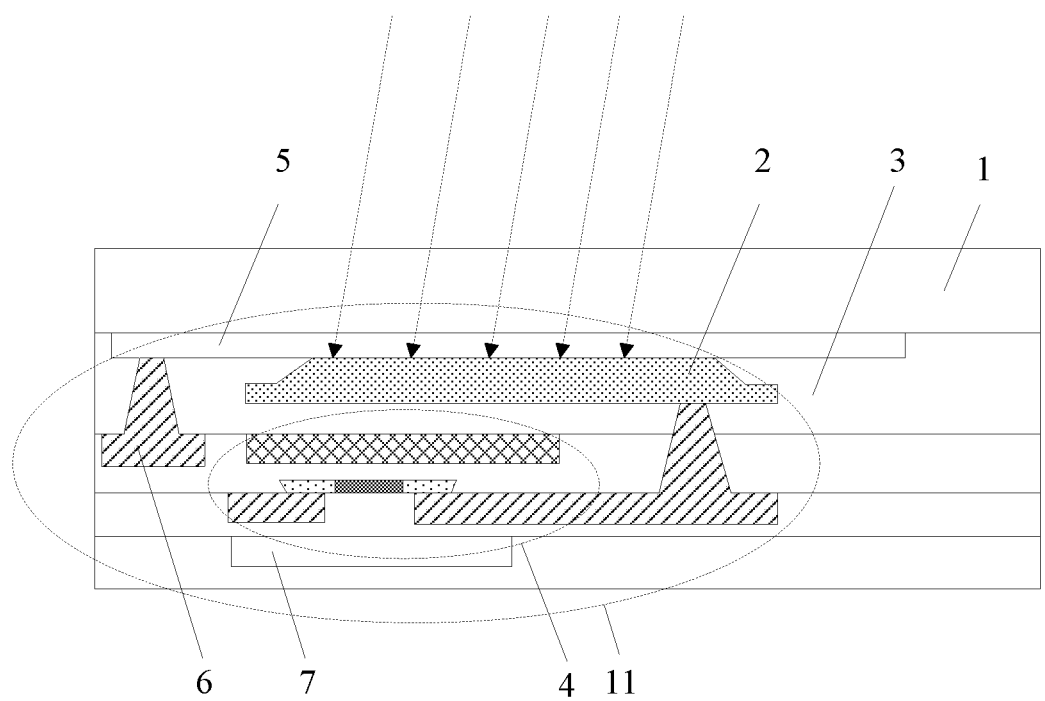
FIG. 3 is a schematic diagram of a region 100 in FIG. 2, wherein light reflected by a valley B arrives.

For example, as shown in FIG. 3 which is a schematic diagram of a region 100 in FIG. 2, light 101 reflected by the valleys B reaches the photosensitive sense electrode 2 of the fingerprint identification unit 11, so that the fingerprint identification unit 11 can generate the current signal.

Figure 4:
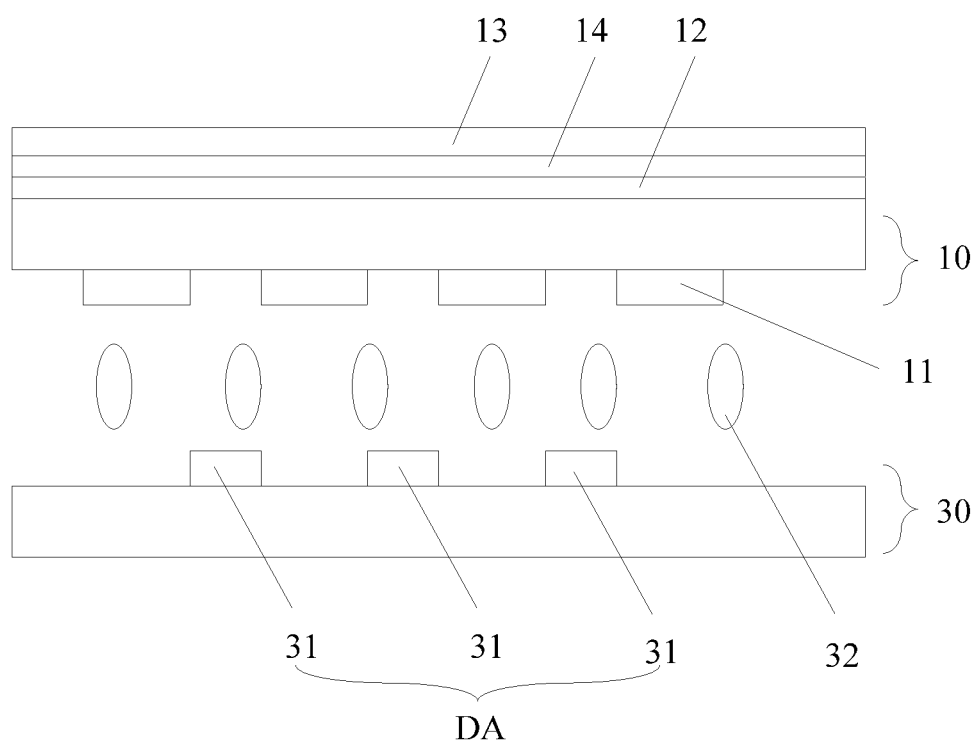
FIG. 4 is a structural schematic diagram of another display panel provided by an embodiment of the present disclosure.

As shown in FIG. 4, the display panel further includes a liquid crystal display module 30, the fingerprint identification substrate 10 is positioned on a light emergent side of the liquid crystal display module 30, the liquid crystal display module 30 includes an array substrate, and a plurality of pixel units 31 are arranged on a surface of the array substrate facing to the fingerprint identification substrate 10; and each fingerprint identification unit 11 of the fingerprint identification substrate 10 respectively corresponds to a region position between the respective pixel units 31. Certainly, liquid crystals 32 may be arranged between the fingerprint identification substrate 10 and the liquid crystal display module 30. Herein, the pixel unit 31 is an example of the display unit, and a plurality of pixel units 31 forms the display unit array.

The fingerprint identification substrate 10 can be flexibly arranged, and for example, the surface where the fingerprint identification unit 11 of the fingerprint identification substrate 10 is positioned faces the array substrate; for another example, the surface where the fingerprint identification unit 11 of the fingerprint identification substrate 10 is positioned faces away from the array substrate.

A principle of the display panel as shown in FIG. 4 for fingerprint identification is similar with that of the display panel as shown in FIG. 2, and is not repeated herein.

In order to enable the display panel to have a better display effect and based on the aim of protecting the display panel, for example, the display panel further includes a polarizing film layer 12 and a protective cover board 13 which are formed on a surface of the fingerprint identification substrate 10 facing away from the array substrate, and the polarizing film layer 12 is adhered to the protective cover board 13 via an optical adhesive layer 14.

An embodiment of the present disclosure further provides a display apparatus, which includes the display panel provided by the above-mentioned embodiments.

The embodiment of the present disclosure has the beneficial effects that: in the fingerprint identification substrate 10, as shown in FIG. 1, adopted by the display panel or the display apparatus, the photosensitive sense electrode 2, the insulating layer 3 and the thin film transistor 4, which the fingerprint identification unit 11 includes, are laminated in the direction substantially perpendicular to the base substrate 1, and thus, the area occupied by the fingerprint identification unit 11 is reduced, and when the fingerprint identification substrate 10 is applied to the display panel, the aperture ratio can be improved, so that the display effect is improved; and meanwhile, the photosensitive sense electrode 2 can have a larger area, and performance of the fingerprint identification unit 11 is improved.

Figure 5:
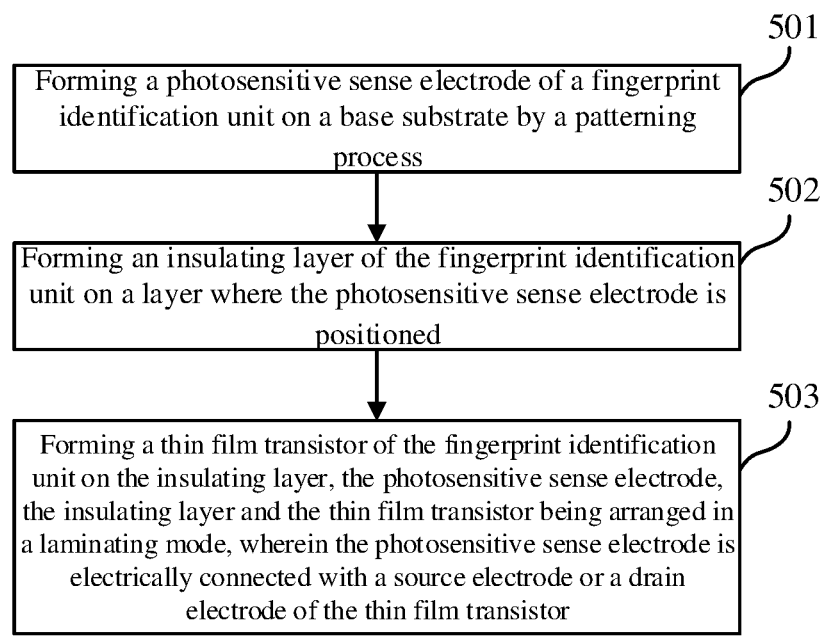
FIG. 5 is a flow chart of a fabrication method of a fingerprint identification substrate, which is provided by an embodiment of the present disclosure.

With reference to FIG. 5, an embodiment of the present disclosure further provides a fabrication method of a fingerprint identification substrate, including:

S501: forming a photosensitive sense electrode of a fingerprint identification unit on a base substrate by a patterning process.

S502: forming an insulating layer of the fingerprint identification unit on a layer where the photosensitive sense electrode is positioned.

S503: forming a thin film transistor of the fingerprint identification unit on the insulating layer, the photosensitive sense electrode, the insulating layer and the thin film transistor being arranged in a laminating mode, wherein the photosensitive sense electrode is electrically connected with a source electrode or a drain electrode of the thin film transistor.

The photosensitive sense electrode overlaps with the thin film transistor in a direction substantially perpendicular to the base substrate.

For example, when a gate electrode of the thin film transistor is formed, a signal line positioned on a same layer with the gate electrode and configured for extending to an external circuit is formed, and the signal line is electrically connected with the photosensitive sense electrode.

Before a plurality of photosensitive sense electrodes are formed on the base substrate by the patterning process, a first transparent electrode is formed on the base substrate by a patterning process, and the first transparent electrode is in direct contact with the photosensitive sense electrode; and The signal line is electrically connected with the photosensitive sense electrode via the first transparent electrode.

The embodiment of the present disclosure has the beneficial effects that: the photosensitive sense electrode, the insulating layer and the thin film transistor, which the fingerprint identification unit of the fingerprint identification substrate includes, are laminated in the direction substantially perpendicular to the base substrate, and thus, the area occupied by the fingerprint identification unit is reduced, and when the fingerprint identification substrate is applied to the display panel, the aperture ratio can be improved, so that the display effect is improved; meanwhile, the photosensitive sense electrode can have a larger area, and performance of the fingerprint identification unit is improved.

It is evident that one person skilled in the art can make various changes or modifications to the present disclosure without departure from the spirit and scope of the disclosure. Thus, if these changes and modifications to the present disclosure are within the scope of the claims of the present invention and equivalent technologies, the present disclosure also intends to include all such changes and modifications within its scope.

The foregoing embodiments merely are exemplary embodiments of the disclosure, and not intended to define the scope of the disclosure, and the scope of the disclosure is determined by the appended claims.

The present application claims priority of the Chinese Patent Application No. 201610509585.9 filed on Jun. 30, 2016, the disclosure of which are incorporated herein by its reference in its entirety as part of the present application.

The invention claimed is:

1. A fingerprint identification substrate, comprising a base substrate and a plurality of fingerprint identification units on the base substrate, wherein each fingerprint identification unit includes a photosensitive sense electrode and a thin film transistor which are positioned on the base substrate, the photosensitive sense electrode is positioned between the base substrate and the thin film transistor, the photosensitive sense electrode is configured to convert light to a current signal and the photosensitive sense electrode is electrically connected with a source electrode or a drain electrode of the thin film transistor, and the photosensitive sense electrode and a gate electrode, an active layer and the source electrode of the thin film transistor are located on the base substrate in sequence in a direction substantially perpendicular to the base substrate.

2. The fingerprint identification substrate according to claim 1, wherein the photosensitive sense electrode and each of the gate electrode, the active layer, the source electrode, and the drain electrode of the thin film transistor are overlapped with each other in the direction substantially perpendicular to the base substrate.

3. The fingerprint identification substrate according to claim 1, wherein each fingerprint identification unit further includes a signal line, the signal line and a gate electrode of the thin film transistor are arranged on a same layer, and the signal line is electrically connected with the photosensitive sense electrode.

4. The fingerprint identification substrate according to claim 3, wherein each fingerprint identification unit further includes a first transparent electrode, and the first transparent electrode is arranged between the photosensitive sense electrode and the base substrate and is in direct contact with the photosensitive sense electrode; and the signal line is electrically connected with the photosensitive sense electrode via the first transparent electrode.

5. The fingerprint identification substrate according to claim 4, wherein an orthogonal projection of the photosensitive sense electrode on the base substrate locates in an orthogonal projection of the first transparent electrode on the base substrate.

6. The fingerprint identification substrate according to claim 1, wherein the fingerprint identification unit further includes a shielding layer direct above the thin film transistor; and orthogonal projections of the thin film transistor and the photosensitive sense electrode on the base substrate locate in an orthogonal projection of the shielding layer on the base substrate.

7. The fingerprint identification substrate according to claim 6, wherein the shielding layer and the thin film transistor are insulated from each other.

8. The fingerprint identification substrate according to claim 1, wherein the fingerprint identification unit further includes a second transparent electrode, the second transparent electrode is arranged between the photosensitive sense electrode and the thin film transistor and is in direct contact with the photosensitive sense electrode, and the orthogonal projection of the photosensitive sense electrode on the base substrate completely coincides with an orthogonal projection of the second transparent electrode on the base substrate.

9. The fingerprint identification substrate according to claim 1, wherein orthogonal projections of the signal line and the transparent electrodes on the base substrate at least partially overlap.

10. The fingerprint identification substrate according to claim 1, wherein the thin film transistor is of bottom gate type.

11. A display panel, comprising: the fingerprint identification substrate according to claim 1, and a display unit array.

12. The display panel according to claim 11, wherein the display unit array includes a plurality of organic light emitting units, the fingerprint identification substrate is positioned on a light emergent side of the plurality of organic light emitting units, and the plurality of organic light emitting units are configured to emit light to pass through portions of the fingerprint identification substrate, which are positioned between a plurality of fingerprint identification units.

13. The display panel according to claim 11, further comprising a liquid crystal layer positioned between the fingerprint identification substrate and the display unit array, wherein the display unit array includes a plurality of pixel units, the fingerprint identification substrate is positioned on a light emergent side of the plurality of pixel units, and the plurality of pixel units are configured to emit light to pass through portions of the fingerprint identification substrate, which are positioned between the plurality of fingerprint identification units.

14. The display panel according to claim 11, further comprising another base substrate opposite to the fingerprint identification substrate, and the display unit array is positioned on a side of the another base substrate facing to the fingerprint identification substrate.

15. The display panel according to claim 11, further comprising a polarizing film layer and a protective cover board which are positioned on a side of the fingerprint identification substrate facing away from the fingerprint identification substrate, and an optical adhesive layer positioned between the polarizing film layer and the protective cover board.

16. A display apparatus, comprising the display panel according to claim 11.

17. A fabrication method of a fingerprint identification substrate, comprising:

forming a photosensitive sense electrode on a base substrate, wherein the photosensitive sense electrode is configured to convert light to a current signal; and forming a thin film transistor on the photosensitive sense electrode, wherein the photosensitive sense electrode is positioned between the base substrate and the thin film transistor, and the photosensitive sense electrode is electrically connected with a source electrode or a drain electrode of the thin film transistor, and the photosensitive sense electrode and a gate electrode, an active layer and the source electrode of the thin film transistor are located on the base substrate in sequence in a direction substantially perpendicular to the base substrate.

18. The method according to claim 17, wherein the photosensitive sense electrode and each of the gate electrode, the active layer, the source electrode, and the drain electrode of the thin film transistor overlap with each other in the direction substantially perpendicular to the base substrate.

19. The method according to claim 17, further comprising: forming a signal line electrically connected with the photosensitive sense electrode, wherein the signal line and a gate electrode of the thin film transistor are simultaneously formed on the same layer.

20. The method according to claim 17, before the photosensitive sense electrode is formed, further comprising: forming a first transparent electrode on the base substrate, wherein the first transparent electrode is in direct contact with the photosensitive sense electrode; and the signal line is electrically connected with the photosensitive sense electrode via the first transparent electrode.

* * * * *